(12) United States Patent
Kudo et al.

(10) Patent No.: US 7,595,141 B2
(45) Date of Patent: Sep. 29, 2009

(54) COMPOSITION FOR COATING OVER A PHOTORESIST PATTERN

(75) Inventors: Takanori Kudo, Bedminster, NJ (US);
Munirathna Padmanaban, Bridgewater, NJ (US); Ralph R. Dammel, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 510 days.

(21) Appl. No.: 10/973,633

(22) Filed: Oct. 26, 2004

(65) Prior Publication Data

US 2006/0088788 A1 Apr. 27, 2006

(51) Int. Cl.
G03F 7/00 (2006.01)
G03F 7/004 (2006.01)

(52) U.S. Cl. ............... 430/270.1; 430/273.1; 430/311; 524/366; 524/376; 524/378; 435/287.8

(58) Field of Classification Search ............ 430/270.1, 430/273.1; 524/366, 376, 378; 435/287.8; 106/724, 727
See application file for complete search history.

(56) References Cited

U.S. PATENT DOCUMENTS

| 3,104,205 | A | | 9/1963 | Hainer et al. ............... 424/48 |
|---|---|---|---|---|
| 5,368,642 | A | * | 11/1994 | Rodrigues et al. .......... 106/727 |
| 5,585,219 | A | | 12/1996 | Kaimoto et al. ............ 430/270.1 |
| 5,843,624 | A | | 12/1998 | Houlian et al. ............. 430/296 |
| 5,858,620 | A | | 1/1999 | Ishibashi et al. ............ 430/313 |
| 5,863,707 | A | | 1/1999 | Lin ............................ 430/313 |
| 6,147,249 | A | | 11/2000 | Watanabe et al. ........... 560/120 |
| 6,274,286 | B1 | | 8/2001 | Hatakeyama et al. ....... 430/189 |
| 6,274,289 | B1 | * | 8/2001 | Subramanian et al. ... 430/273.1 |
| 6,319,853 | B1 | | 11/2001 | Ishibashi et al. ............ 438/780 |
| 6,365,322 | B1 | | 4/2002 | Padmanaban et al. ..... 430/270.1 |
| 6,447,980 | B1 | | 9/2002 | Rahman et al. ............ 430/270.1 |
| 6,555,607 | B1 | * | 4/2003 | Kanda et al. ................ 524/366 |
| 7,141,177 | B2 | | 11/2006 | Tanaka ....................... 216/41 |
| 7,189,783 | B2 | * | 3/2007 | Kozawa et al. .............. 525/61 |
| 2001/0044070 | A1 | | 11/2001 | Uetani et al. | |
| 2003/0091732 | A1 | | 5/2003 | Kanda ........................ 427/162 |
| 2003/0129538 | A1 | | 7/2003 | Sheu et al. | |
| 2004/0058269 | A1 | * | 3/2004 | Hada et al. ................. 430/270.1 |
| 2004/0229170 | A1 | | 11/2004 | Kanda ........................ 430/311 |
| 2005/0175926 | A1 | * | 8/2005 | Sugeta et al. ............... 430/270.1 |
| 2006/0160015 | A1 | | 7/2006 | Takano et al. .............. 430/270.1 |
| 2006/0183218 | A1 | | 8/2006 | Takahashi et al. .......... 435/287.8 |
| 2006/0188805 | A1 | * | 8/2006 | Nozaki et al. .............. 430/270.1 |
| 2006/0188807 | A1 | * | 8/2006 | Nozaki et al. .............. 430/270.1 |
| 2006/0211814 | A1 | | 9/2006 | Nishikawa et al. .......... 524/557 |
| 2007/0048659 | A1 | * | 3/2007 | Namiki et al. ............. 430/270.1 |
| 2007/0059644 | A1 | | 3/2007 | Takahashi et al. | |
| 2007/0248770 | A1 | | 10/2007 | Takahashi et al. | |
| 2008/0073322 | A1 | * | 3/2008 | Nozaki et al. ................. 216/49 |
| 2008/0193880 | A1 | | 8/2008 | Nishibe et al. | |

FOREIGN PATENT DOCUMENTS

| EP | 0 794 458 A2 | 9/1997 |
|---|---|---|
| WO | WO 97/33198 | 9/1997 |
| WO | WO 00/17712 | 3/2000 |
| WO | WO 00/67072 | 9/2000 |
| WO | WO 01/98834 A1 | 12/2001 |
| WO | WO 02/065212 A1 | 8/2002 |

OTHER PUBLICATIONS

Tran et al., "Metal-Catalized Vinyl Addition Polymers for 157 nm Resist Applications. 2. Fluorinated Norbornenes: Synthesis, Polymerization, and Initial Imaging Results", Macromolecules vol. 35, pp. 6539-pp. 6549 (2002).
Kodama et al., "Synthesis of Novel Fluoropolymer for 157nm Photoresists by Cyclo-polymerization", Proc. SPIE vol. 5690, p. 76-pp.83 (2002).
Notification Concering Transmittal of International Preliminary report on Patentability (Chapter I of the Patent Cooperation Treaty) Form PCT/IB/326, International Preliminary Report on Patentability (Form PCT/IB/373), and Written Opinion of the International Searching Authority (PCT/ISA237) for corresponding PCT application PCT/IB2005/003347.

* cited by examiner

Primary Examiner—Amanda C. Walke
(74) Attorney, Agent, or Firm—Sangya Jain

(57) ABSTRACT

The present invention relates to an aqueous coating composition for coating a photoresist pattern comprising a polymer containing amino group. The present invention also relates to a process for manufacturing a microelectronic device comprising providing a substrate with a photoresist pattern, coating the photoresist pattern with the novel coating material reacting a portion of the coating material in contact with the photoresist pattern, and removing a portion of the coating material which is not reacted with a removal solution.

12 Claims, 2 Drawing Sheets

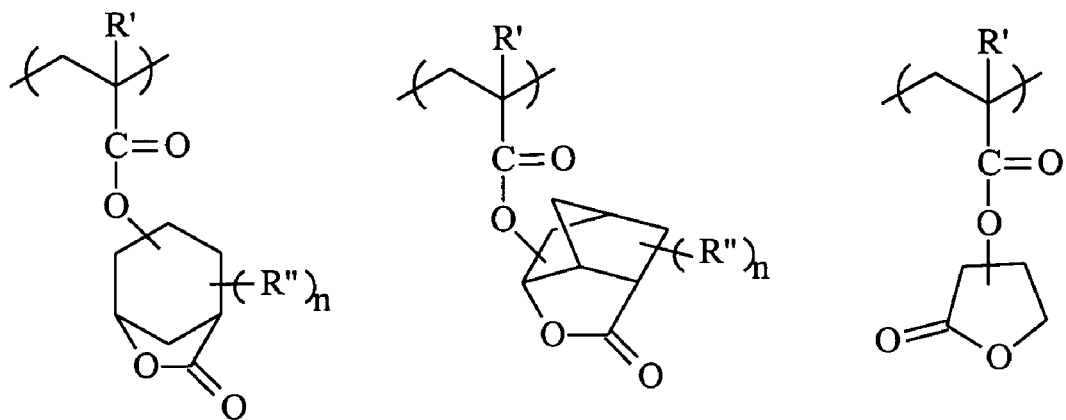
Figure 1: Examples of lactone containing monomeric units
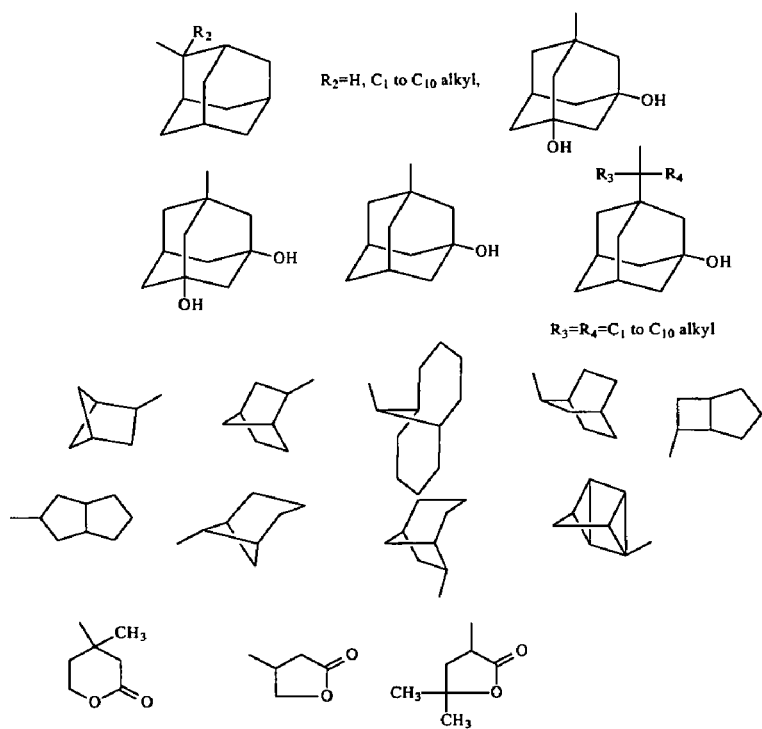
Figure 2: Examples of pendant groups from the acrylate comonomer

Figure 3: Examples of multicyclic monomers
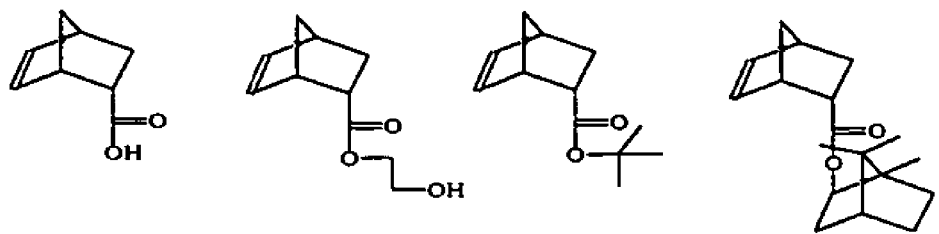
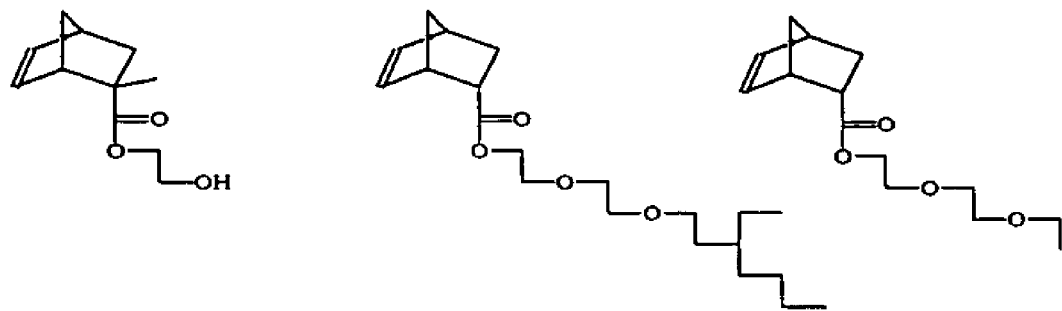
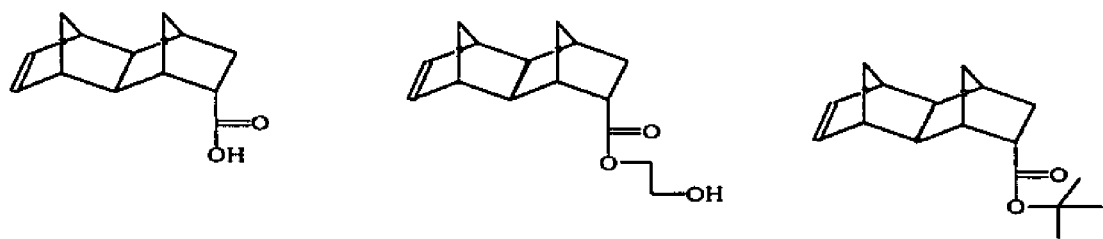

COMPOSITION FOR COATING OVER A PHOTORESIST PATTERN

TECHNICAL FIELD

The present invention relates to a composition for coating over a photoresist pattern to improve lithographic performance and also relates to a process for using such a coating for making an image on a substrate.

BACKGROUND ART

The densification of integrated circuits in semiconductor technology has been accompanied by a need to manufacture very fine interconnections within these integrated circuits. Ultra-fine patterns are typically created by forming patterns in a photoresist coating using photolithographic techniques. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

Miniaturization of integrated circuits requires the printing of narrower and narrower dimensions within the photoresist. Various technologies have been developed to shrink the photoresist dimensions, examples of such technologies are, multilevel coatings, antireflective coatings, phase-shift masks, photoresists which are sensitive at shorter and shorter wavelengths, etc.

One important process for printing smaller dimensions relies on the technique of forming a thin layer on top of the image of the photoresist, which widens the photoresist image but reduces the dimension of the space between adjacent photoresist patterns. This narrowed space can be used to etch and define the substrate or be used to deposit materials, such as metals. This bilevel technique allows much smaller dimensions to be defined as part of the manufacturing process for microelectronic devices, without the necessity of reformulating new photoresist chemistries. The top coating layer or shrink material may be an inorganic layer such as a dielectric material, or it may be organic such as a crosslinkable polymeric material.

Dielectric shrink materials are described in U.S. Pat. No. 5,863,707, and comprise silicon oxide, silicon nitride, silicon oxynitride, spin on material or chemical vapor deposited material. Organic polymeric coatings are described in U.S. Pat. No. 5,858,620, where such coatings undergo a crosslinking reaction in the presence of an acid, thereby adhering to the photoresist surface, but are removed where the top shrink coating has not been crosslinked. U.S. Pat. No. 5,858,620 discloses a method of manufacturing a semiconductor device, where the substrate has a patterned photoresist which is coated with a top layer, the photoresist is then exposed to light and heated so that the photogenerated acid in the photoresist diffuses through the top layer and can then crosslink the top layer. The extent to which the acid diffuses through the top coat determines the thickness of the crosslinked layer. The portion of the top layer that is not crosslinked is removed using a solution that can dissolve the polymer.

The present invention relates to a coating composition of a shrink material comprising a polymer comprising amino groups. A polymer comprising amino groups is particularly useful for coating over photoresists sensitive at 193 nm and 157 nm, where the photoresist polymer comprises groups that can react with a base. The object of the invention is to form a coating over the imaged photoresist which reacts with the photoresist and stabilizes the photoresist pattern and further increases the thickness of the photoresist. It has been unexpectedly found that the use of this novel coating shrink composition leads to improved pattern definition, higher resolution and stable pattern formation of imaged photoresist.

BRIEF DESCRIPTION OF DRAWINGS

FIG. 1 describes some lactone containing monomeric units in a photoresist polymer.

FIG. 2 discloses various types of groups pendant from an acrylate comonomer.

FIG. 3 shows examples of cyclic monomers useful for obtaining a photoresist polymer.

SUMMARY OF THE INVENTION

The present invention relates to an aqueous coating composition for coating a photoresist pattern comprising a polymer containing amino group, preferably primary amine group. The present invention also relates to a process for manufacturing a microelectronic device comprising providing a substrate with a photoresist pattern, coating the photoresist pattern with the novel coating material reacting a portion of the coating material in contact with the photoresist pattern, and removing a portion of the coating material which is not reacted with a removal solution.

DESCRIPTION OF THE INVENTION

The present invention relates to an aqueous shrink coating composition comprising a polymer containing amino groups. The invention also relates to a process for manufacturing a microelectronic device, comprising forming a layer of shrink coating material on top of an imaged photoresist pattern, reacting a portion of the shrink material near the photoresist interface, and removing the unreacted, soluble portion of the shrink material with a removal solution.

An imaged pattern of photoresist is formed on a substrate according to processes well-known to those skilled in the art.

Photoresists can be any of the types used in the semiconductor industry. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working photo resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Generally, a photoresist comprises a polymer and a photosensitive compound. Examples of photoresist systems, without limitation, are novolak/diazonaphthoquinone, polyhydroxystyrene/onium salts, capped polyhydroxystyrene/onium salts, cycloaliphatic polymers/onium salts, fluoropolymers/onium salts, etc. These photoresists are well-known for use at wavelengths ranging from 436 nm to 157 nm. Any type of photoresist that is capable of forming an image may be used. A photoresist is coated on a substrate, and the photoresist coating is baked to remove substantially all of the coating solvent. The coating is then exposed with the appropriate wavelength of light, and developed with a suitable developer.

Once a photoresist pattern is defined on the substrate, a shrink material comprising an aqueous polymer containing amino group is coated over the substrate with the photoresist pattern and reacted with the surface of the photoresist to form an interface layer which is insoluble in the aqueous removing solution. The interface layer is formed by heating the substrate as a suitable temperature for a suitable time. The amino group of the shrink material reacts with the polymer of the photoresist, where the photoresist polymer contains functionalities that can react with the amino group, such as lactones, anhydrides and esters. The unreacted portion of the shrink coating is removed by the removal solution. Typical examples of suitable systems for a shrink material that can react with the underlying photoresist are an aqueous solution comprising a polymer comprising amino groups, specifically primary amine groups (—NH$_2$). The amine group, with a free proton, is pendant from the polymer, and may be connected to the polymer through a (C$_1$-C$_{10}$) alkyl group, where the alkyl group is linear or branched or cylic. Examples of polymers that are useful are homopolymers and copolymers of allylamine, such as, polyallylamine, poly(allylamine-co-methacylic acid), poly(allylamine-co-acrylic acid), poly(allylamine-co-acrylamide), poly(allylamine-co-N-alkyl acrylamide), poly(allylamine-co-acrylic acid-co-methacrylic acid), poly(allylamine-co-acrylic acid-co-acrylamide), etc. Other polymers are poly(oxyalkylene) having amino groups, such as bis(3-aminopropyl) terminated poly(oxyethylene), amine terminated poly(ethyleneoxide), poly(propylene glycol) bis(2-aminoproplyl ether), etc can be exemplified. Besides, mixtures of the above mentioned polymers, secondary water soluble polymers such as poly(vinylalcohol), poly (methacylic acid), poly(acrylic acid), poly(oxyalkylene), poly(acrylamide), poly(vinylpyrrolidinone) etc may be added to the shrink material composition.

If the molecular weight of shrink material is too low, pattern shrinkage is not enough. On the other hand, if the molecular weight is too high, unreacted shrink material is not removed. Accordingly the weight average molecular weight of polymer for the shrink material ranges from approximately 3,000 to 200,000, preferably from Mw 5,000 to 100,000, and more preferably from 10,000 to 80,000.

The shrink material comprises a water soluble polymer containing amino group and water, where the polymer concentration ranged from about 1 weight % to about 20 weight %, preferably 2-10 weight %, and more preferably 2-6 weight %, depending on the physical parameters of the polymer and the different chemical compositions of the polymer. Additives and/or other solvents that are miscible with water may be added to the composition. Solvents such as alcohols, particularly, isopropanol, may be added. In one embodiment, the coating composition does not contain a crosslinking agent, especially melamine and urea based crosslinking agents. Crosslinking agents are not necessary for the reaction between the polymer of the top coat and the photoresist polymer, since the present invention involves a base induced reaction of the functionality in the photoresist polymer. Therefore, in one embodiment the shrink material composition is free of crosslinking agents.

Photoresist compositions comprise a polymer, a photoactive compound and solvent. Photoresists that are particularly suitable are those which contain polymers with functionalities that can react with the amino group of the shrink coating polymer. Although not wishing to be bound by theory, it is believed that the amino group reacts with functional groups to bond with the photoresist polymer and form an interface layer, which stabilizes the photoresist pattern and also increases the overall dimensions of the photoresist. Typically, photoresist polymers containing groups such as lactones, anhydrides, and esters are preferred, and such polymers are most often used for photoresists useful for imaging at 193 nm and 157 nm. Photoresist polymers containing functional groups such as lactones, anhydrides, esters and photoresist systems are described in the following patents and incorporated herein by reference US 2001/0044070, U.S. Pat. Nos. 5,843,624, 6,147,249, and 6,447,980. Examples of photoresist polymers comprising at least one unit with a lactone group are shown in FIG. 1, where R' and R" are independently hydrogen, OH and (C$_1$-C$_6$)alkyl, and n=1-3. Specifically, US 2001/0044070, describes monomeric units containing various types of lactone groups which can form part of a photoresist polymer, more specifically acrylate lactones.

Photoresist polymers comprising anhydride groups may be those exemplified by maleic anhydride and fumaric anhydride.

Photoresist polymers comprising at least one unit with an ester group are exemplified by alkyl esters or alicyclic esters, preferably tertiary esters, such as tertiary butyl esters, 2-alkyl-2-adamantyl esters, 2-methyl-2adamantyl esters, 2-ethyl-2-adamantyl esters, etc.

Photoresists sensitive at 193 nm that are known in the prior art are described in the following references and incorporated herein, EP 794458, WO 97/33198 and U.S. Pat. No. 5,585, 219, although any photoresist containing a functional group which reacts with an amine from the top layer may be used. Photoresists sensitive to 193 nm and 157 nm are particularly useful and are based on alicyclic polymers, particulary those based on cycloolefin copolymers, cycloolefin/maleic anhydride copolymers, cycloolefin/maleic anhydride/acrylate copolymers, acrylate/adamantane/lactone copolymers, cycloolefin/cyanoacrylate copolymers, fluorinated cycloolefin copolymers, cycloolefin/fluorinated acrylate copolymers. Such photoresists are described in the following references which are incorporated by reference: U.S. Pat. Nos. 6,447,980, and 6,365,322.

The acrylate monomer or monomers used in the synthesis of the polymer are of the following structure, furthermore, acrylate as referred to in this application refers generally to alkyl substituted or unsubstituted monomers, such as methacrylate, ethacrylate, etc.:

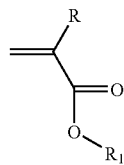

where, $R_1$ is a cyclic moiety or an alkyl moiety, preferably the cyclic moiety is a nonaromatic cyclic moiety and where, R in the above structures is hydrogen or ($C_1$-$C_4$) alkyl. One unit may be a where $R_1$ is a lactone. Examples of structures for $R_1$ are shown in FIG. 2.

The cyclo olefin is incorporated into the backbone of the polymer and may be any substituted or unsubstituted multicyclic hydrocarbon containing an unsaturated bond. The polymer may be synthesized from one or more cyclo olefin monomers having an unsaturated bond. The cyclo olefin monomers may be substituted or unsubstituted norbornene, or tetracyclododecne. The substituents on the cyclo olefin may be aliphatic or cycloaliphatic alkyls, esters, acids, hydroxyl, nitrile or alkyl derivatives. Examples of cyclo olefin monomers, without limitation, are given in FIG. 3.

The cyclo olefin monomer may be selected from t-butyl norbornene carboxylate (BNC), hydroxyethyl norbornene carboxylate (HNC), norbornene carboxylic acid(NC), t-butyl tetracyclo[4.4.0.1.$^{2,6}$1.$^{7,10}$] dodec-8-ene-3-carboxylate, and t-butoxycarbonylmethyl tetracyclo[4.4.0.1.$^{2,6}$1.$^{7,10}$] dodec-8-ene-3-carboxylate; more preferably the cyclo olefins are selected from t-butyl norbornene carboxylate (BNC), hydroxyethyl norbornene carboxylate (HNC), and norbornene carboxylic acid(NC).

The preferred acrylate monomers may be selected from mevaloniclactone methacrylate (MLMA), mevaloniclactone acrylate (MLA), 2-methyladamantyl methacrylate (MAdMA), 2-methyladamantyl acrylate (MAdA), 2-ethyladamantyl methacrylate (EAdMA), 2-ethyladamantyl acrylate (EAdA), isobornyl methacrylate, isobornyl acrylate, 3-hydroxy-1-methacryloxyadamatane, 3-hydroxy-1-acryloxyadamatane, 3,5-dihydroxy-1-methacryloxyadamatane, 3,5-dihydroxy-1-acryloxyadamatane, β-methacryloxy-γ-butyrolactone, β-acryloxy-γ-butyrolactone, α-methacryloxy-γ-butyrolactone, α-acryloxy-γ-butyrolactone norbornenelactone methacrylate, norbornenelactone acrylate More preferably the acrylate monomers are selected from mevaloniclactone methacrylate (MLMA), mevaloniclactone acrylate (MLA), 2-methyladamantyl methacrylate (MAdMA), 2-methyladamantyl acrylate (MAdA), 2-ethyladamantyl methacrylate (EAdMA), 2-ethyladamantyl acrylate (EAdA), 3-hydroxy-1-methacryloxyadamatane, 3-hydroxy-1-acryloxyadamatane, α-methacryloxy-γ-butyrolactone, α-acryloxy-γ-butyrolactone norbornenelactone methacrylate, norbornenelactone acrylate. The cyclic anhydride is preferably maleic anhydride.

Examples of photoresist polymers are poly(2-methyl-2-adamantyl methacrylate-co-beta-butyrolactone methacrylate), poly(2-methyl-2-adamantyl acrylate-co-beta-butyrolactone methacrylate), poly(2-methyl-2-adamantyl methacrylate-co-mevalonic lactone methacrylate), poly(2-methyl-2-adamantyl methacrylate-co-norbornene lactone (meth)acrylate), poly(2-methyl-2-adamantyl methacrylate-co-3-hydroxy-1-adamantyl methacrylate-co-beta-butyrolactone methacrylate), poly(2-methyl-2-adamantyl methacrylate-co-3-hydroxy-1-adamantyl methacrylate-co-alpha-butyrolactone methacrylate), poly(2-methyl-2-adamantyl methacrylate-co-3-hydroxy-1-adamantyl acrylate-co-beta-butyrolactone acrylate), poly(2-methyl-2-adamantyl methacrylate-co-3-hydroxy-1-adamantyl methacrylate-co-norbornene lactone methacrylate), poly(norbonyl methacrylate-co-3-hydroxy-1-adamantyl methacrylate-co-beta-butyrolactone methacrylate), poly(2-ethyl-2-adamantyl methacrylate-co-3-hydroxy-1-adamantyl methacrylate-co-norbornene lactone methacrylate), poly(2-ethyl-2-adamantyl methacrylate-co-3-hydroxy-1-adamantyl acrylate-co-beta-butyrolactone acrylate), poly(2-ethyl-2-adamantyl methacrylate-co-3-hydroxy-1-adamantyl methacrylate-co-alpha-butyrolactone methacrylate), poly(2-methyl-2-adamantyl methacrylate-co-2-ethyl-2-adamantyl methacrylate-co-3-hydroxy-1-adamantyl methacrylate-co-norbornene lactone methacrylate), poly(2-methyl-2-adamantyl methacrylate-co-2-ethyl-2-adamantyl methacrylate-co-3-hydroxy-1-adamantyl methacrylate-co-beta-butyrolactone methacrylate), poly(2-methyl-2-adamantyl methacrylate-co-2-ethyl-2-adamantyl methacrylate-co-3-hydroxy-1-adamantyl methacrylate-co-alpha-butyrolactone methacrylate), poly(2-methyl-2-adamantyl methacrylate-co-3-hydroxy-1-adamantyl methacrylate-co-beta-butyrolactone methacrylate-co-norbornene lactone methacrylate) poly(2-methyl-2-adamantyl methacrylate-co-beta-butyrolactone methacrylate-co -norbornene lactone methacrylate).

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (Hoang V. Tran et al Macromolecules 35, 6539, 2002, WO 00/67072, and WO 00/17712) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; WO 02/065212) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. The fluorinated polymers contain at least unit with a lactone group, an anhydride group or an ester group.

Particularly preferred for 193 nm and 157 nm exposure are photoresists comprising non-aromatic polymers, a photoacid generator, optionally a solubility inhibitor, optionally a base, and solvent.

The photoacid generator (PAG) of the novel composition is selected from those which absorb at the desired exposure wavelength, preferably 193 nm and 157 nm. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones.Phenolic sulfonic esters, bis-sulfonylmethanes, bis-sulfonyl methanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates. Mixtures of photoactive compounds may also be used.

In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo[4.3.0]-5-nonene, 1,8-diazabicyclo[5,4,0]-7-undecene, cyclic alkylamines, or polyether bearing amines such as described in U.S. Pat. No. 6,274,286.

The photoresist composition for 193 nm and 157 nm imaging are typically formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono -alkyl ether, propylene glycol alkyl ether acetate, butyl acetate, xylene, 1,3-di(trifluoromethyl)benzene, ethylene glycol monoethyl ether acetate, propylene glycol monomethyl ether acetate, 2-heptanone, ethyl lactate, ethyl-3-ethoxypropionate, and mixtures of ethyl lactate and ethyl-3-ethoxypropionate, among others.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The photoresist is coated on the substrate, image wise exposed with appropriate radiation to which the photoresist is sensitive, baked and developed, according to processes well known in the art.

The novel shrink material of the present invention is then coated over the photoresist and reacted with the photoresist. The thickness of the shrink layer can range from about 50 nm to about 500 nm, preferably 50 nm to 300 nm and more preferably 100 nm to 200 nm. The reaction between the coating material and the photoresist typically occurs during a heating step. The substrate may be heated between 80° C. and 200° C., preferably 90° C. and 180° C., and more preferably between 90° C. and 180° C. for 30 seconds to 180 seconds on a hotplate.

The residual portion of the shrink material that is not reacted is removed using a removal solution. The removal solution may be water or comprises an aqueous solution of a surfactant, which may further comprise an alkali and/or a water-miscible solvent. Examples of an alkali are tetramethyl ammonium hydroxide, tetraethyl ammonium hydroxide, choline or mixtures thereof. Water-miscible solvents are, for example, lower aliphatic alcohols such as ethanol or isopropanol; multifunctional alcohols such as ethylene glycol, propylene glycol, glycerol, or their monomethyl ethers, in particular propylene glycol monomethyl ether (PGME). Water-soluble nonionic surfactants and anionic surfactants were found to provide good lithographic results. Examples of nonionic surfactants are ethylene oxide/propylene oxide polymers, terminated by alkyl, fluoroalkyl, or aromatic groups. Anionic surfactants also gave superior lithographic performance, and examples of such surfactants are, salts of longer-chain alkanoic acids, such as laurates, stearates, or heptanoates, salts of alkyl or aralkyl sulfonic acids, such as laurylsulfonic acid, or variously substituted salts of sulfonic acid amides, or the partially or completely fluorinated derivatives of the above classes of compounds. Ammonium, tetramethyl ammonium, tetraethyl ammonium, or other alkyl ammonium ions are useful counter ions. The actual composition of the removal solution is dependent on factors such as, the shrink material, the desired lithographic performance, compatibility of materials, production specifications, etc.

The removal solution is applied on the surface of the substrate in a manner known in the art. Puddle development, immersion development, spray development or any mixtures of these techniques may be used to remove chemical compositions from the substrate. The time and temperature of the removal process is varied to give the best lithographic properties. Desirable lithographic properties being, for example, (a) cleanliness of the substrate after removal of the unreacted shrink material, that is, the substrate is free from insoluble deposits, stringers, bridges, etc, (b) vertical wall angles, and (c) smooth surfaces.

At current resolution targets it is desirable to obtain a space reduction between photoresist features of from about 70 nm to about 100 nm. The exact space width reduction requirement is highly dependent on the type of microelectronic devices being manufactured.

Once the desired narrow space is formed as defined by the process described above, the device may be further processed as required. Metals may be deposited in the space, the substrate may be etched, the photoresist may be planarized, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Example 1

Photoresist Pattern Formation

A mixture of 34 g of poly(2-methyladamantyl methacrylate-co-beta-butyrolactone methacrylate), 34 g of poly(2-methyladamantyl methacrylate-co-3-hydroxy-1-adamantyl methacrylate-co-beta-butyrolactone methacrylate), 1.5 g of triphenylsulfonium nonafluorobutanesulfonate, 5 g of 1 wt % ethyl lactate solution of diethanolamine and 1.2 g of 10 wt % ethyl lactate solution of a surfactant (fluoroaliphatic polymeric ester, supplied by 3M Corporation, St. Paul Minn.) were dissolved in 923 g of ethyl lactate to give a photoresist solution. The solution was filtered using 0.2 µm filter. Separately, a bottom antireflective coated (B.A.R.C) silicon substrate was prepared by spin coating the bottom anti-reflective coating solution on to the silicon substrate and baked at 175° C. for 60 sec. The B.A.R.C film thickness was kept to 39 nm. The photoresist solution was then coated on the B.A.R.C coated silicon substrate. The spin speed was adjusted such that the photoresist film thickness was 220 nm. The resist film was baked at 115° C. for 60 sec. It was then exposed on a 193 nm scanner (numerical aperture of 0.78 and coherence of 0.9) using a 6% attenuated phase shift mask. After exposure, the wafer was post-exposure baked at 110° C. for 60 sec. and developed using 2.38 wt % aqueous solution of tetramethyl ammonium hydroxide for 60 sec. The contact holes were then observed on a scanning electron microscope. The formulation had a sensitivity of 31.5 mJ/cm$^2$, and resolved 0.1 µm contact holes.

Example 2

The substrate with the photoresist contact hole patterns as described in Example 1 was spin coated with 4% aqueous solution of polyallylamine (Mw 65,000) to give a thickness 200 nm, baked at 110° C. for 60 seconds and developed with water for 60 seconds. The contact holes were then observed on a scanning electron microscope and pattern sizes were compared before and after application of the shrink material. The pattern size was reduced from 0.1 micron to 0.07 micron.

Example 3

The substrate with the photoresist contact hole patterns as described in Example 1 was spin coated with 4% aqueous solution of polyallylamine (Mw 17,000) to give a thickness 200 nm, baked at 110° C. for 60 seconds and developed with water for 60 seconds. The contact holes were then observed on a scanning electron microscope and pattern sizes were compared before and after application of the shrink material. The pattern size was reduced from 0.1 micron to 0.07 micron.

Example 4

The substrate with the photoresist contact hole patterns as described in Example 1 was spin coated with 4% aqueous solution of polyallylamine (Mw 17,000) to give a thickness 200 nm, baked at 120° C. for 60 seconds and developed with water for 60 seconds. The contact holes were then observed on a scanning electron microscope and pattern sizes were compared before and after application of the shrink material. The pattern size was reduced from 0.12 micron to 0.08 micron.

The invention claimed is:

1. An aqueous coating composition for coating a photoresist pattern, comprising a polymer containing a primary amine (—$NH_2$), and further where the composition is basic and free of a crosslinking compound, and furthemore where the composition causes an increase in the thickness of the photoresist pattern.

2. The compostion of claim 1, where the amine is connected to the polymer through a ($C_1$-$C_{10}$) alkyl group.

3. The composition of claim 1, where the polymer is polyallylamine.

4. The composition of claim 1, where the polymer is selected from poly(allylamine-co-methacylic acid), poly(allylamine-co-acrylic acid), poly(allylamine-co-acrylamide), poly(allylamine-co-N-alkyl acrylamide), poly(allylamine-co-acrylic acid-co-methacrylic acid), poly(allylamine-co-acrylic acid-co-acrylamide), bis(3-aminopropyl) terminated poly(oxyethylene), amine terminated poly(ethyleneoxide), and poly(propylene glycol) bis(2-aminoproplyl ether).

5. The composition of claim 1, where the composition further contains a water miscible solvent.

6. A process for manufacturing a microelectronic device, comprising;

a) providing a substrate with a photoresist pattern;

b) coating the photoresist pattern with an aqueous coating composition for coating a photoresist pattern, comprising a polymer containing a primary amine (—NH2), and further where the composition is free of a crosslinking compound, and furthermore where the composition causes an increase in the thickness of the photoresist pattern;

c) reacting a portion of the coating material in contact with the photoresist pattern;

d) removing a portion of the coating material which is not reacted with a removal solution.

7. The process according to claim 6, where the substrate is heated to cause a reaction of the coating material with the photoresist image.

8. The process according to claim 6, where the removal solution is an aqueous solution comprising a hydroxide base.

9. The process according to claim 6, where the removal solution further comprises a water-miscible solvent.

10. The process of claim 6, where the photoresist comprises a polymer comprising a group selected from a lactone, an anhydride and an ester.

11. The compostion of claim 1, where the polymer is a copolymer of allylamine.

12. The process of claim 6, where the aqueous coating composition is basic.

* * * * *